(12) United States Patent
Mazzillo

(10) Patent No.: US 9,806,216 B2
(45) Date of Patent: Oct. 31, 2017

(54) SEMICONDUCTOR DEVICE FOR A SYSTEM FOR MEASURING THE TEMPERATURE, AND MANUFACTURING METHOD THEREOF

(71) Applicant: STMICROELECTRONICS S.R.L., Agrate Brianza (IT)

(72) Inventor: Massimo Cataldo Mazzillo, Corato (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/052,695

(22) Filed: Feb. 24, 2016

(65) Prior Publication Data

US 2017/0018674 A1    Jan. 19, 2017

(30) Foreign Application Priority Data

Jul. 14, 2015 (IT) .................... 102015000033950

(51) Int. Cl.

| | | |
|---|---|---|
| *H01L 31/108* | (2006.01) | |
| *G01J 5/22* | (2006.01) | |
| *H01L 31/028* | (2006.01) | |
| *H01L 31/0224* | (2006.01) | |
| *H01L 31/18* | (2006.01) | |
| *H01L 27/144* | (2006.01) | |
| *G01K 7/01* | (2006.01) | |

(52) U.S. Cl.
CPC .............. *H01L 31/108* (2013.01); *G01J 5/22* (2013.01); *G01K 7/01* (2013.01); *H01L 27/1443* (2013.01); *H01L 31/028* (2013.01); *H01L 31/022408* (2013.01); *H01L 31/1812* (2013.01)

(58) Field of Classification Search
CPC ..... H01L 29/82; H01L 29/06; H01L 31/0328; H01L 31/0336; H01L 31/108; G01J 5/22; G01K 7/01
See application file for complete search history.

(56) References Cited

U.S. PATENT DOCUMENTS

| | | | | |
|---|---|---|---|---|
| 6,034,404 | A * | 3/2000 | Soares ..................... | G01K 7/01 257/415 |
| 8,916,825 | B1 * | 12/2014 | Egerton .................. | G01J 5/046 250/338.4 |
| 2002/0155634 | A1 | 10/2002 | D'Evelyn et al. | |
| 2011/0233418 | A1 * | 9/2011 | Horsfall .................. | G01T 1/241 250/370.14 |

FOREIGN PATENT DOCUMENTS

WO    2012/115502 A1    8/2012

\* cited by examiner

*Primary Examiner* — David Porta
*Assistant Examiner* — Faye Boosalis
(74) *Attorney, Agent, or Firm* — Seed IP Law Group LLP

(57) ABSTRACT

A semiconductor device for a system for measuring temperature, which includes a first UV detector and a second UV detector. The first and second UV detectors generate a first current and a second current, respectively, as a function of the irradiance in the ultraviolet band. Moreover, the first and second UV detectors have coefficients of variation of the current with temperature, at constant irradiance, that are different from one another.

20 Claims, 7 Drawing Sheets

SEMICONDUCTOR DEVICE FOR A SYSTEM FOR MEASURING THE TEMPERATURE, AND MANUFACTURING METHOD THEREOF

BACKGROUND

Technical Field

The present disclosure relates to a semiconductor device for a system for measuring temperature. Moreover, the present disclosure regards the corresponding manufacturing method.

Description of the Related Art

As is known, numerous devices are today available that enable measurement of ultraviolet irradiance, i.e., the amount of ultraviolet radiation to which they are subjected. These devices are commonly known as UV detectors and have non-zero sensitivity in at least part of the spectral region of ultraviolet radiation, which is comprised between 100 nm and 400 nm. In this connection, ultraviolet radiation is divided into:

UVA radiation, with wavelengths in the range [315-400] nm;
UVB radiation, with wavelengths in the range [280-315] nm; and
UVC radiation, with wavelengths in the range [100-280] nm.

For instance, UV detectors are known that enable determination of the amount of ultraviolet radiation to which a person is subjected during daily life. Such UV detectors commonly equip personal systems such as, for example, cellphones and wearable devices in such a way that the latter are able to supply the user with indications regarding, precisely, the amount of ultraviolet radiation that impinges thereon. Furthermore, generally such UV detectors provide an index known as "UV index" (UVI), which is defined as:

$$UVI = K_{er} \cdot \int_{280nm}^{400nm} S_{er}(\lambda) \cdot F(\lambda) \cdot d\lambda$$

where $K_{er}$ is a constant equal to 40 m$^2$/W, $S_{er}(\lambda)$ is the so-called "erythema reference action spectrum", which is established by the International Lighting Commission (CIE) and $F(\lambda)$ is the solar spectral irradiance, expressed in W/(m$^2$·nm). As the UV index increases, the danger of radiation increases.

Once again by way of example, other UV detectors are instead used in the field of detection of flames originating from the combustion of hydrocarbons, for example of a gaseous type. In this case, the radiation emitted has a peak around 310 nm and is characterized by an extremely weak radiant flux. Consequently, detection is rendered possible by the fact that UV detectors are substantially insensitive to visible radiation.

BRIEF SUMMARY

This having been said, the present applicant has noted how the need is felt to have available a UV detector that, in addition to supplying a first quantity indicating irradiance in the ultraviolet, will supply also a second quantity, indicating the temperature at which the detector itself is set. In this connection, the present Applicant has noted how today measurement of the temperature is carried out in a way independent of detection of the ultraviolet irradiance by resorting to corresponding devices. For instance, as regards detection of temperature, devices are known, such as pyrometers, thermocouples, and the so-called "resistance temperature detectors" (RTDs). However, the use of different devices for detection of ultraviolet radiation and for measurement of temperature entails an increase in the costs and overall dimensions.

One embodiment of the present disclosure is a semiconductor device for a system for measuring temperature that will overcome the drawbacks of the known art at least in part.

At least one embodiment of the present disclosure is a semiconductor device for a system for measuring temperature. The device includes a first UV detector and a second UV detector, the first and second UV detectors being configured to generate a first current and a second current, respectively, as a function of an ultraviolet irradiance. The first and second UV detectors have coefficients of variation of current with temperature, at constant irradiance, that are different from one another.

At least one embodiment of the present disclosure is a manufacturing method that includes manufacturing a semiconductor device for a system for measuring temperature. The manufacturing includes forming a first UV detector and a second UV detector, which are configured to generate a first current and a second current, respectively, as a function of the irradiance in the ultraviolet band. Forming said first and second UV detectors includes forming said first and second UV detectors with coefficients of variation of the current with temperature, at constant irradiance, that are different from one another.

BRIEF DESCRIPTION OF THE SEVERAL VIEWS OF THE DRAWINGS

For a better understanding of the present disclosure, preferred embodiments thereof are now described, purely by way of non-limiting examples and with reference to the attached drawings, wherein.

DETAILED DESCRIPTION

The present semiconductor device stems from the idea of exploiting, for measuring the temperature, two different UV detectors, which have different curves of spectral response as the temperature varies.

Figure 1:
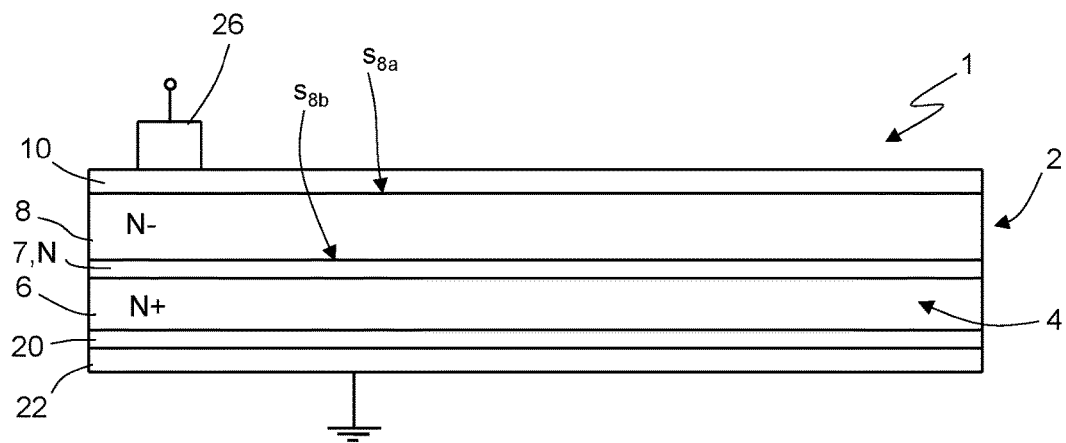
FIG. 1 is schematic cross-sectional view (not in scale) of a UV detector.
Figure 2:
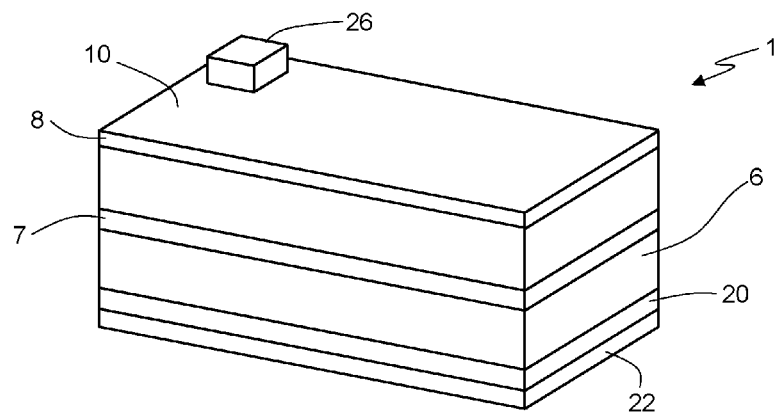
FIG. 2 is a schematic perspective view (not in scale) of the UV detector illustrated in FIG. 1.

In detail, FIGS. 1 and 2 show a first UV detector 1, which is formed in a first die 2 of semiconductor material, which in turn comprises a semiconductor body 4, made for example of silicon carbide, and in particular of the so-called "4H-polytype silicon carbide" (4H-SiC).

In greater detail, the semiconductor body 4 comprises a substrate 6 of an N+ type (for example doped with nitrogen), which has a doping level for example of $1\times10^{19}$ cm$^{-3}$ and a thickness for example of 200 µm. Furthermore, the semiconductor body 4 comprises a buffer epitaxial layer 7 and a front epitaxial layer 8, both of an N− type.

The buffer epitaxial layer 7 extends over the substrate 6 and is in direct contact with the latter. Furthermore, the buffer epitaxial layer 7 is of an N type, has a doping level, for example, of between $5\times10^{15}$ cm$^{-3}$ and $5\times10^{16}$ cm$^{-3}$ and a thickness comprised, for example, of between 0.3 µm and 1 µm.

The front epitaxial layer 8 is of an N− type, has a doping level, for example, of between $8\times10^{13}$ cm$^{-3}$ and $2\times10^{14}$ cm$^{-3}$, and has a thickness, for example, of between 4 µm and 8 µm. The front epitaxial layer 8 is delimited at the top and at the bottom by a first surface $S_{8a}$ and a second surface $S_{8b}$, respectively. The second surface $S_{8b}$ contacts the buffer epitaxial layer 7.

The first UV detector 1 further comprises an anode region 10, which is made of nickel silicide (Ni$_2$Si) and extends on the first surface $S_{8a}$, in contact with the front epitaxial layer 8. The anode region 10 has a thickness comprised, for example, between 10 nm and 30 nm. Moreover, as illustrated in FIG. 2, the anode region 10 is in the form of a continuous layer, i.e., it is not patterned. In top plan view, this continuous layer has, for example, a square shape.

Extending underneath the substrate 6, and in direct contact with the latter, is a region 20, referred to hereinafter as the "bottom contact region" 20. The bottom contact region 20 is formed by nickel silicide and has a thickness comprised, for example, between 100 nm and 400 nm.

The first UV detector 1 further comprises a bottom multilayer structure 22, set underneath the bottom contact region 20 and in contact with the latter. In a way in itself known, the bottom multilayer structure 22 may be formed by a succession of three corresponding layers, which are made, for example, of titanium (Ti), of nickel (Ni), and of gold (Au) and have thicknesses, for example, of 400 nm, 100 nm, and 50 nm, respectively. The bottom multilayer structure 22 functions as bottom metallization, and in particular as cathode metallization.

The first UV detector 1 further comprises a top metallization 26, which extends over the anode region 10, with which it is in direct contact. In top plan view, the top metallization 26 has an area smaller than that of the anode region 10 and extends on a peripheral portion of the latter.

Even though not illustrated, in a way in itself known the top metallization 26 may include a respective titanium layer (not illustrated), arranged in contact with the underlying anode region 10, and an overlying region (not illustrated) made of a conductive alloy (for example, AlSiCu). The titanium layer and the overlying region of conductive alloy of the top metallization 26 may have thicknesses, for example, of 80 nm and 3.2 µm, respectively.

In practice, the anode region 10 and the front epitaxial layer 8 form a first metal-semiconductor junction of a rectifying type, i.e., characterized by the presence of a Schottky barrier. Furthermore, the substrate 6 and the bottom contact region 20 form a second metal-semiconductor junction, of a non-rectifying type; i.e., they form a so-called ohmic contact.

In greater detail, to a first approximation, the anode region 10 is semitransparent to ultraviolet radiation. Moreover, the aforementioned first metal-semiconductor junction forms a sensor designed to detect ultraviolet radiation, i.e., to generate a current indicating the intensity of ultraviolet radiation. In this connection, in use, the bottom multilayer structure 22 is set to ground, whereas the top metallization 26 is set at a first, non-positive, voltage V1. Furthermore, the front epitaxial layer 8 has a doping such that it can be completely depleted also in the case where the first voltage V1 has in modulus a very low value (possibly zero, in which case the first UV detector 1 operates in photovoltaic regime). In this way, the detection efficiency is optimized.

Figure 3:
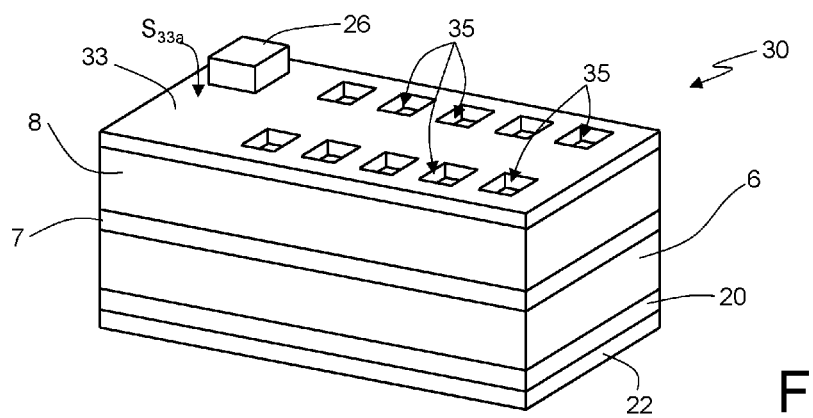
FIGS. 3 and 4 are schematic perspective views (not in scale) of further examples of UV detectors.
Figure 4:
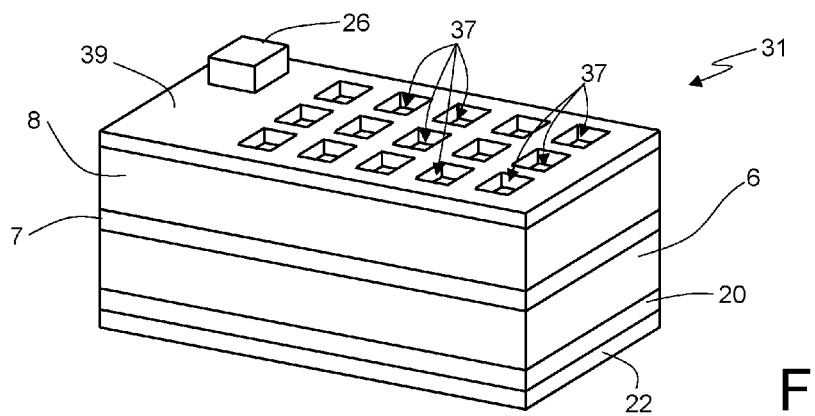

FIGS. 3 and 4 show a second UV detector and a third UV detector, designated by 30 and 31, respectively, which in what follows are described limitedly to the differences with respect to the first UV detector 1. Moreover, components of the second and third UV detectors 30, 31 already present in the first UV detector 1 are designated by the same references, except where otherwise specified.

In detail, the anode region of the second UV detector 30, designated by 33, differs from the anode region 10 of the first UV detector 1 in that it is patterned. In fact, the anode region 33 comprises a plurality of cavities 35. In particular, if we designate the top surface of the anode region 33 as "third surface $S_{33a}$", each cavity 35 extends between the third surface $S_{33a}$ and the first surface $S_{8a}$; i.e., it sets in communication a portion of the front epitaxial layer 8 with the space overlying the anode region 33. In other words, each cavity 35 exposes a corresponding underlying portion of the front epitaxial layer 8.

Purely by way of example, each cavity 35 may have the shape of a parallelepiped with square base. Moreover, without any loss of generality, the cavities 35 are arranged in a regular way, for example in the nodes of a hypothetical first square-mesh network.

As regards the third UV detector 31, it is, for example, the same as the second UV detector 30, but the cavities (designated by 37), arranged once again in the nodes of a hypothetical second square-mesh network, are spaced apart with a spacing smaller than the spacing present between the cavities 35 of the second UV detector 30. Furthermore, the anode region of the third detector 31 is designated by 39.

The third UV detector 31 is hence characterized by a ratio between the exposed area of the first surface $S_{8a}$ and the total area of the first surface $S_{8a}$ higher than the corresponding ratio that characterizes the second UV detector 30. Equivalently, the third UV detector 31 is characterized by a ratio between the exposed area of the first surface $S_{8a}$ and the area of the envelope of the anode region 39 higher than the corresponding ratio that characterizes the second UV detector 30.

The currents generated by the first, second, and third UV detectors 1, 30, 31 are linearly proportional to the ultraviolet irradiance. In this connection, in what follows, except where otherwise specified, the irradiance is to be understood as irradiance in the ultraviolet band.

Figure 5A:
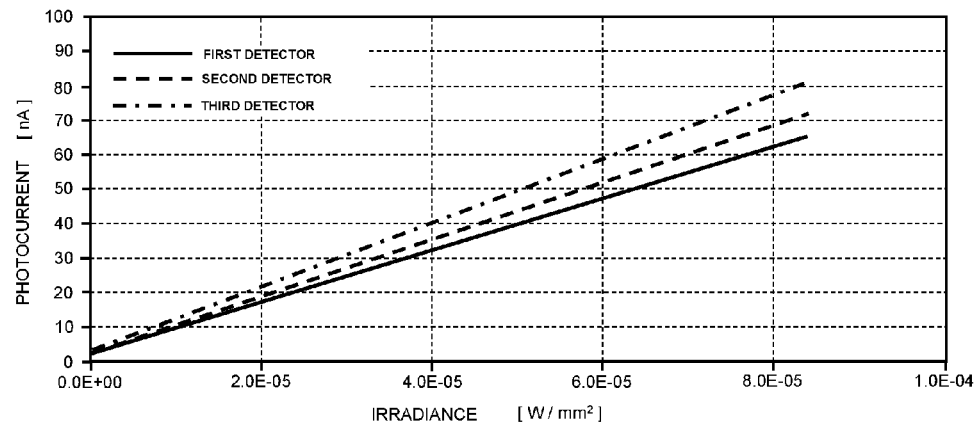
FIG. 5a shows examples of plots as a function of the irradiance, at constant temperature, of photocurrents generated by the three detectors illustrated in FIGS. 2, 3, and 4.

In greater detail, the first, second, and third UV detectors 1, 30, 31 are characterized by different detection efficiencies since the respective semiconductor surfaces exposed have different areas. In this connection, it is found that the detection efficiency, and hence the coefficient of variation of the current with irradiance at constant temperature, is linearly proportional to the area of semiconductor exposed, as illustrated for example in FIG. 5a.

Figure 5B:
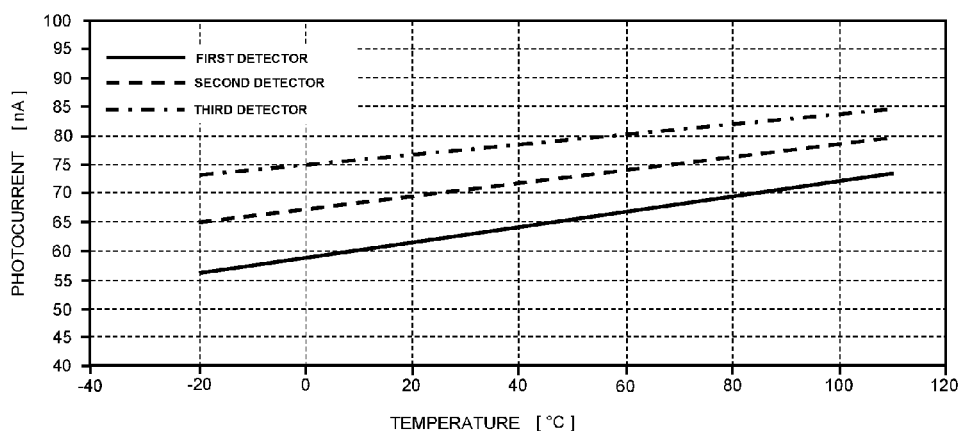
FIG. 5b shows examples of plots as a function of the temperature, at constant irradiance, of photocurrents generated by the three detectors illustrated in FIGS. 2, 3 and 4.

Furthermore, assuming a constant irradiation, it is found that the current generated by each of the first, second, and third UV detectors 1, 30 and 31 depends linearly upon the temperature, as illustrated in FIG. 5b. Furthermore, the amount of the variation of the current with temperature, i.e., the angular coefficient of the straight line that correlates the current with temperature, also depends upon the area of the semiconductor surface exposed. More in particular, given the same area of the first surface $S_{8a}$, the coefficient of variation of the current with temperature at constant irradiance decreases as the area of the semiconductor surface exposed increases. The present Applicant has noted that the latter phenomenon depends upon the silicidation process (described hereinafter) carried out for forming the anode region. In fact, during this process an interaction between nitrogen $N_2$ and silicon carbide occurs, which entails creation of defects that are optically active at high temperature, with consequent reduction of the lifetime of the photogenerated carriers. Since the interaction is proportional to the area of the surface exposed, the variation of current, as the temperature increases, is less marked in UV detectors with larger exposed area. Once again in greater detail, the present Applicant has noted that said interaction and the consequent effects increase as the temperature and duration of the annealing process (described hereinafter) increase, and moreover as the flow of nitrogen $N_2$ in the annealing chamber increases. The variation of these process parameters hence enables modulation of the coefficient of variation of the current with temperature at constant irradiance.

Figure 5C:
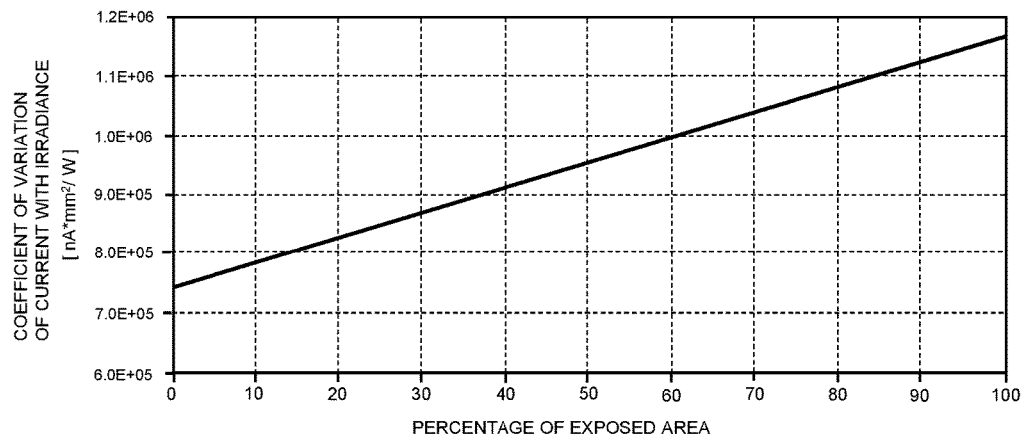
FIG. 5c shows an example of plot of the coefficient of variation of the current with irradiance (at constant temperature) as a function of a percentage of exposed area of a UV detector.
Figure 5D:
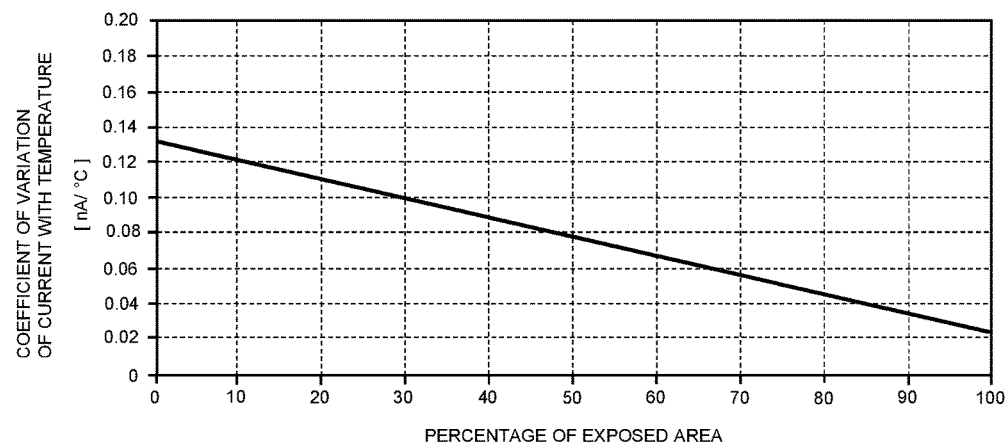
FIG. 5d shows an example of plot of the coefficient of variation of the current with temperature (at constant irradiance) as a function of a percentage of exposed area of a UV detector.

An example of the plot of the coefficient of variation of the current with irradiance (at constant temperature), as a function of the percentage of exposed area of the first surface $S_{8a}$ (with respect to the total area of the first surface $S_{8a}$), is illustrated in FIG. 5c. Furthermore, FIG. 5d shows an example of plot of the coefficient of variation of the current with temperature (at constant irradiance), as a function of the aforementioned percentage of exposed area. In what follows, for brevity, by "percentage of exposed area" is meant the ratio between the area of the exposed portion of the first surface $S_{8a}$, and hence of the exposed portion of the front epitaxial layer 8, and the total area of the first surface $S_{8a}$.

In practice, given any one of the first, second, and third UV detectors 1, 30, 31, the variation of the current as a function of the incident ultraviolet irradiance P and of the temperature T can be expressed as $$\Delta I(P,T) \approx \Delta I(P) + \Delta I(T) = \alpha \Delta P + \beta \Delta T$$

where: $\alpha$ is the corresponding coefficient of variation of the current with irradiance, at constant temperature, whereas $\beta$ is the corresponding coefficient of variation of the current with temperature, at constant irradiance; and $\Delta P$ and $\Delta T$ are variations of ultraviolet irradiance and temperature, respectively.

Figure 6:
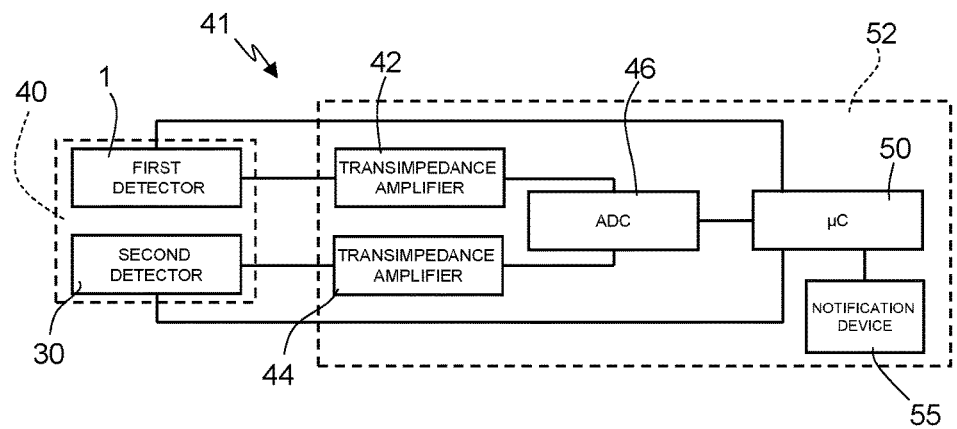
FIG. 6 shows a block diagram of a measuring system comprising the present semiconductor device.

All this having been said, FIG. 6 shows an embodiment of the present device, which enables determination of an estimate of the ultraviolet irradiance and an estimate of the temperature, this device being referred to hereinafter as "detection device" 40. As illustrated in FIG. 6, the detection device 40 forms a measuring system 41.

In detail, and without any loss of generality, the detection device 40 comprises the first and second UV detectors 1, 30, which are hence subjected to the same conditions of ultraviolet irradiance and temperature.

The measuring system 41 further comprises a first transimpedance amplifier 42 and a second transimpedance amplifier 44, an analog-to-digital converter 46, and a microcontroller unit 50. Purely by way of example, the first and second transimpedance amplifiers 42, 44, the analog-to-digital converter 46, and the microcontroller unit 50 may be formed within an ASIC (Application-Specific Integrated Circuit), provided for example in a die 52 different from the dice of the first and second UV detectors 1, 30.

The microcontroller unit 50 is electrically connected to the top metallizations of the first and second UV detectors 1, 30 so as to bias the latter, for example by applying corresponding negative voltages.

The first and second transimpedance amplifiers 42, 44 are connected to the first and second UV detectors 1, 30, respectively, in order to receive the respective currents generated. In this connection, even though in FIG. 6, for reasons of clarity, each one of the first and second UV detectors 1, 30 has been represented with two terminals, one connected to the microcontroller unit 50 and the other to the corresponding transimpedance amplifier, these are in actual fact connected to one and the same terminal, formed by the corresponding top metallization. For instance, with reference to the first UV detector 1, the microcontroller unit 50 and the first transimpedance amplifier 42 are both connected to the top metallization 26 of the first UV detector 1.

The outputs of the first and second transimpedance amplifiers 42, 44 are connected to a first input and to a second input, respectively, of the analog-to-digital converter 46, which, in a way in itself known, supplies to the microcontroller unit 50 the digital values of the currents generated by the first and second UV detectors 1, 30.

In connection with the currents generated by the first and second UV detectors 1, 30, if we designate, respectively, by $\alpha_1$ and $\alpha_2$ the coefficients of variation of the current with irradiance, at constant temperature, of the first and second UV detectors 1, 30, and by $\beta_1$ and $\beta_2$ the coefficients of variation of the current with temperature, at constant irradiance, of the first and second UV detectors 1, 30, we have $$\Delta I_1(P,T) \approx \Delta I_1(P) + \Delta I_1(T) = \alpha_1 \cdot \Delta P + \beta_1 \cdot \Delta T$$

$$\Delta I_2(P,T) \approx \Delta I_2(P) + \Delta I_2(T) < \alpha_2 \cdot \Delta P + \beta_2 \cdot \Delta T$$

where $\Delta I_1$ and $\Delta I_2$ are the variations of the currents generated, respectively, by the first and second UV detectors 1, 30, and where $\alpha_1 \neq \alpha_2$ and $\beta_1 \neq \beta_2$, because the first and second UV detectors 1, 30 have different percentages of exposed area. The two previous equations hence define a system of two equations in two unknowns ($\Delta P$ and $\Delta T$), which can be solved, after having determined experimentally $\alpha_1$, $\beta_1$, $\alpha_2$, and $\beta_2$. In particular, the condition $\beta_1 \neq \beta_2$ guarantees that the system is solvable.

In greater detail, the microcontroller unit 50 determines the values of the quantities $\Delta I_1$ and $\Delta I_2$, on the basis of the digital values of the currents generated by the first and second UV detectors 1, 30 supplied by the analog-to-digital converter 46. The microcontroller unit 50 hence determines an estimate of the ultraviolet irradiance, for example on the basis of the value of at least one of the two currents generated by the detection device 40.

Next, the microcontroller unit 50 solves the aforementioned system, and then determines the values of the quantities $\Delta P$ and $\Delta T$ on the basis of the values of the quantities $\Delta I_1$ and $\Delta I_2$ and of the coefficients $\alpha_1$, $\alpha_2$, $\beta_1$, and $\beta_2$.

In other words, the microcontroller unit 50 measures the variations $\Delta I_1$, $\Delta I_2$ of the currents generated by the detection device 40, on the basis of which an estimate of the variation of temperature $\Delta T$ is then determined. Optionally, the microcontroller unit 50 may determine also an estimate of the (absolute) temperature at which the detection device 40 is found. For this purpose, the measuring system 41 may, for example, undergo a preliminary calibration step; i.e., it is set in known conditions of ultraviolet irradiance and temperature. In such known conditions, the microcontroller unit 50 determines the corresponding currents generated by the first and second UV detectors 1, 30, which are designated in what follows as $I_{offset1}$ and $I_{offset2}$. If then we designate by $I_1$ and $I_2$ the currents generated by the first and second UV detectors 1, 30, respectively, during a subsequent operating step different from the calibration step, the microcontroller unit 50 determines $\Delta I_1 = I_1 - I_{offset1}$ and $\Delta I_2 = I_2 - I_{offset2}$. Consequently, the variations $\Delta P$ and $\Delta T$ refer to the (known) conditions of ultraviolet irradiance and temperature of the calibration step. In this way, the microcontroller unit 50 is able, for example, to determine the temperature of the detection device 40 on the basis of the known temperature of the calibration step and of the quantity $\Delta T$.

The microcontroller unit 50 may notify a user of the quantities determined thereby; for this purpose, the measuring system 41 may comprise a notification device 55, operatively coupled to the microcontroller unit 50 and constituted, for example, by a display.

The measuring system 41 may present numerous variants with respect to what has been described. In general, the detection device 40 may be formed by any pair of UV detectors chosen from among the first, second, and third UV detectors, 1, 30, 31. Once again, even more in general, the detection device 40 may be formed by any pair of UV detectors whose coefficients of variation of the current with temperature, at constant irradiance, are different from one another. For practical purposes, if we designate the aforesaid coefficients once again by $\beta_1$ and $\beta_2$, they may differ from one another to an extent such that $|(\beta_1-\beta_2)/\beta_1| \geq 5\%$. It is thus possible, for example, for the detection device 40 to be formed by two UV detectors, which have the same percentages of exposed area but the anode regions of which have different geometries.

The sensitivity of the measuring system 41 increases as the differences present between the coefficients of variation of the current with temperature of the detectors that form the detection device 40 increase, and moreover as the differences between the coefficients of variation of the current with irradiance of these detectors increase.

Figure 7:
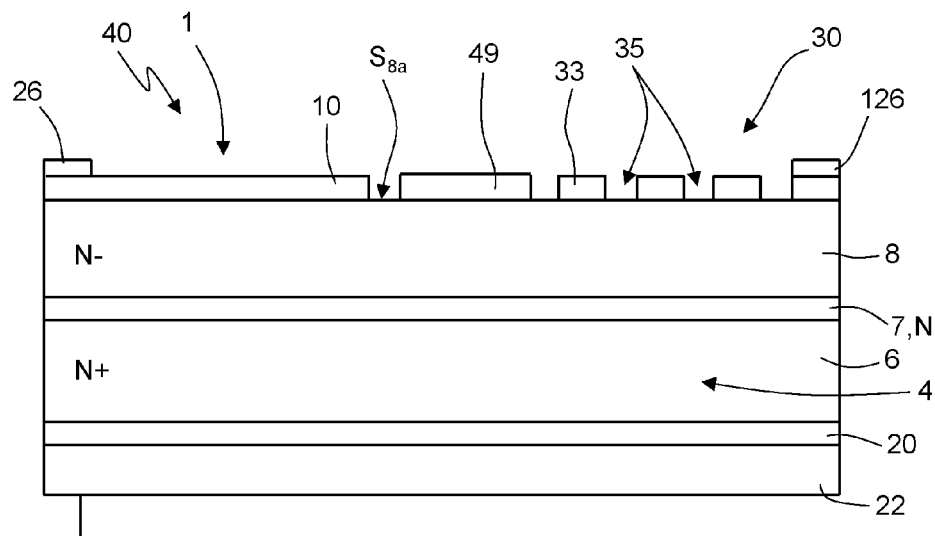
FIG. 7 is a schematic cross-sectional view (not in scale) of an embodiment of the present semiconductor device.

Purely by way of example, FIG. 7 illustrates an embodiment in which, without any loss of generality, the detection device 40 is formed once again by the first and second UV detectors 1, 30, which are integrated in one and the same die (designated once again by 2) and share the semiconductor body 4, the bottom contact region 20, and the bottom multilayer structure 22. The components shared by the first and second UV detectors 1, 30 are designated by the same references used in FIG. 1. Moreover, the top metallization of the second UV detector 30 is here designated by 126. In this way, the first and second UV detectors 1, 30 share the cathode terminal, set to ground, whereas the respective anode regions are biased independently. In addition, the currents generated by the respective UV detectors are collected through the anode regions.

In greater detail, in the embodiment illustrated in FIG. 7, the detection device 40 further comprises a dielectric region 49, made for example of TEOS, arranged on top of the first surface $S_{8a}$, with which it is in direct contact, and arranged between the anode region 10 of the first UV detector 1 and the anode region 33 of the second UV detector 30.

Once again by way of example, moreover possible are embodiments (not illustrated) in which the detection device 40 is formed by a pair of UV detectors that are separate from one another, have the same geometries, but are obtained with manufacturing processes that differ as regards at least one parameter of the silicidation step (described hereinafter), which leads to formation of the respective anode regions in a way such that the respective coefficients of variation of the current with temperature, at constant irradiance, are different from one another.

The embodiment of the detection device 40 illustrated in FIG. 7 may be obtained with the manufacturing method described in what follows.

Figure 8:
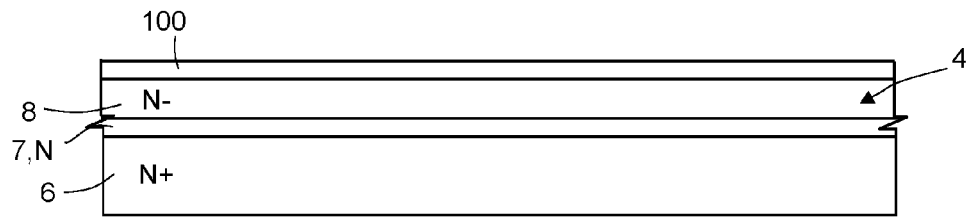
FIGS. 8-17 are schematic cross-sectional views (not in scale) of an embodiment of the present semiconductor device, during successive steps of a manufacturing process.

As illustrated in FIG. 8, initially the semiconductor body 4 is provided, in which the substrate 6 has, for example, a thickness of 350 µm. In addition, formed on the front epitaxial layer 8 is a sacrificial layer 100, made of dielectric material (for example, TEOS). The sacrificial layer 100 has a thickness, for example, of 0.8 µm and performs a protective function.

Figure 9:
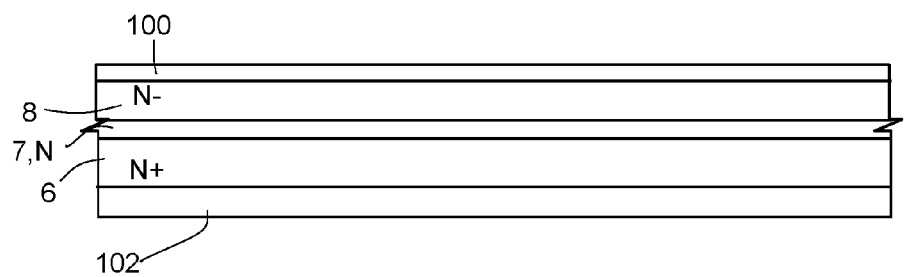

Next, as illustrated in FIG. 9, the thickness of the substrate 6 is optionally reduced by back grinding, for example to 200 µm. Moreover formed underneath the substrate 6, and hence on the back of the integrated electronic device 1, is a layer 102, referred to hereinafter as the "first conductive layer" 102. The first conductive layer 102 is made of nickel. In addition, the first conductive layer 102 is formed, for example, by sputtering and has a thickness, for example, of approximately 200 nm.

Figure 10:
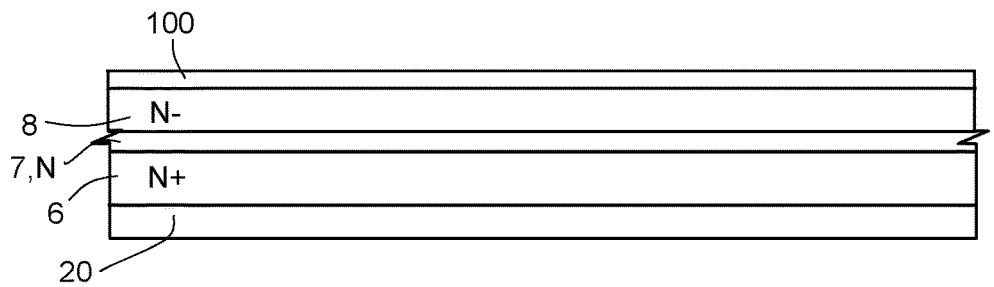

Next, as illustrated in FIG. 10, a first annealing is carried out in an environment containing nitrogen gas ($N_2$), following upon which the first conductive layer 102 forms the bottom contact region 20. For instance, the first annealing is carried out at a temperature of 1000° C. and lasts approximately 60 s.

Figure 11:
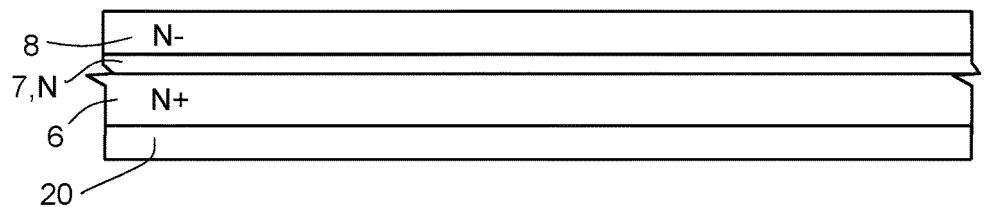

Then, as illustrated in FIG. 11, the sacrificial layer 100 is removed, for example by means of a wet etch.

Figure 12:
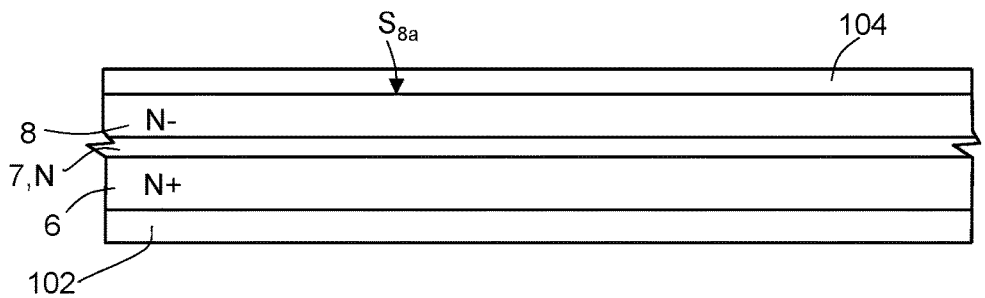

Next, as illustrated in FIG. 12, formed on the front epitaxial layer 8 is a second conductive layer 104. In particular, the second conductive layer 104 is made of nickel, has a thickness, for example, of 10 nm, and is formed, for example, by sputtering.

Figure 13:
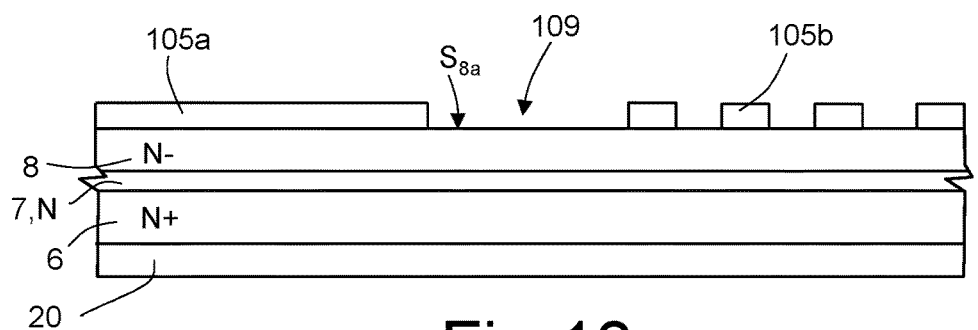

Then, as illustrated in FIG. 13, a portion of the second conductive layer 104 is selectively removed using a corresponding photomask (not illustrated) and a subsequent wet etch. In this way, a first portion and a second portion of the second conductive layer 104 are formed, which are designated by 105a and 105b, respectively, and are laterally spaced apart and are intended to form, respectively, the anode region 10 of the first ultraviolet receiver 1 and the anode region 33 of the second ultraviolet receiver 30. More in particular, in top plan view, the first and second portions 105a, 105 of the second conductive layer 104 have, respectively, the same shape as the anode region 10 of the first ultraviolet receiver 1 and the anode region 33 of the second ultraviolet receiver 30. Furthermore, the aforementioned selective removal entails formation, between the first and second portions 105a, 105b of the second conductive layer 104, of a window 109. In other words, a corresponding portion of the first surface $S_{8a}$ is exposed. The window 109 separates the first and second portions 105a, 105b of the second conductive layer 104.

Figure 14:
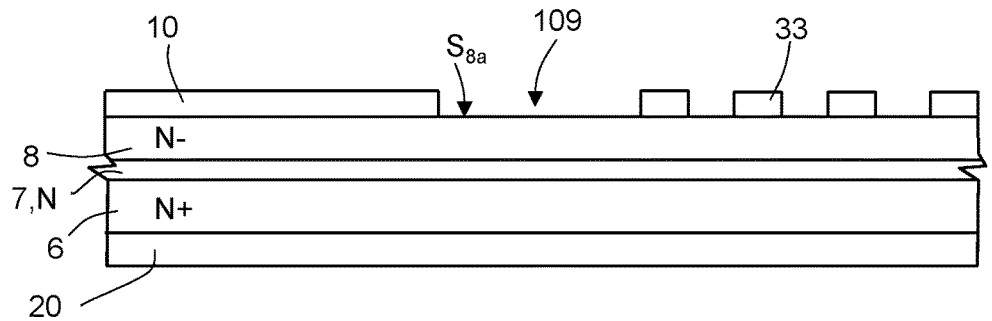

Next, as illustrated in FIG. 14, a second annealing is carried out in an environment containing nitrogen gas ($N_2$), following upon which the first and second portions 105a, 105b of the second conductive layer 104 form, respectively, the anode region 10 of the first UV detector 1 and the anode region 33 of the second UV detector 30, which, as has been said, are made of nickel silicide ($Ni_2Si$). For instance, the second annealing is carried out at a temperature of 700° C. and lasts approximately 20 s.

Figure 15:
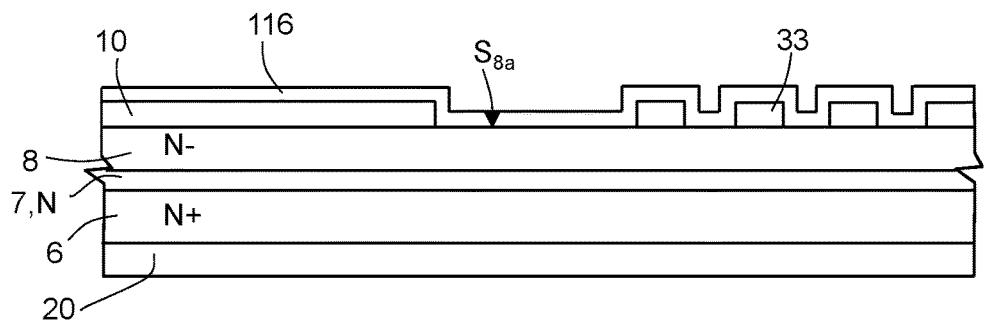

Next, as illustrated in FIG. 15, a dielectric layer 116, made for example of TEOS, is formed, for instance by deposition. In particular, the dielectric layer 116 is formed on the anode region 10 of the first UV detector 1 and the anode region 33 of the second UV detector 30, as well as on the exposed portions of the first surface $S_{8a}$.

Figure 16:
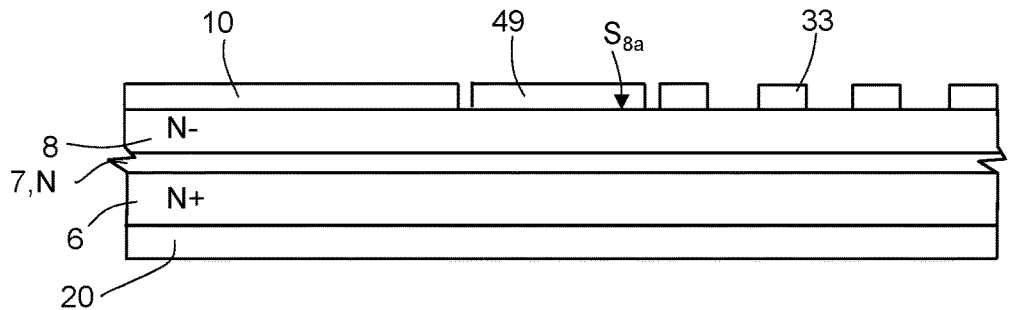

Next, as illustrated in FIG. 16, portions of the dielectric layer 116 are selectively removed in such a way that the remaining portion of dielectric layer 116 forms the dielectric region 49. For instance, selective removal is performed by carrying out a wet etch, resorting to a corresponding mask (not illustrated).

Figure 17:
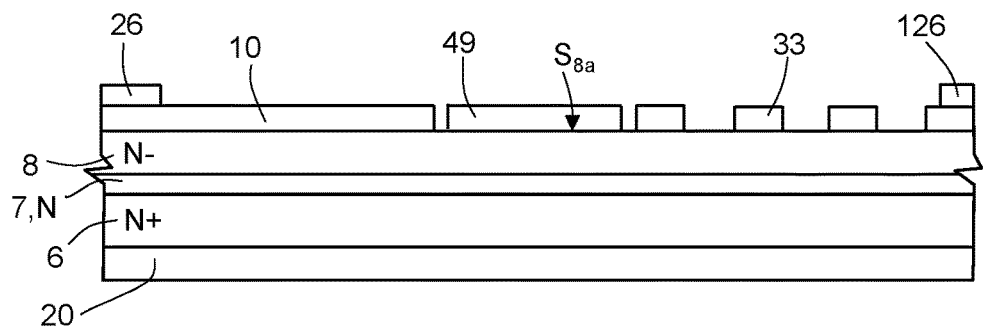

Then, as illustrated in FIG. 17, in a way in itself known the top metallization 26 of the first UV detector 1 and the top metallization 126 of the second UV detector 30 are formed. Finally, in a way in itself known and not illustrated, the bottom multilayer structure 22 is formed, for example by sputtering.

From what has been described and illustrated previously, the advantages that the present solution affords emerge clearly.

In particular, the present device enables simultaneous determination, in a compact way, of an estimate of ultraviolet irradiance and an estimate of temperature, and thus enables, for example, an estimate of the variation of temperature as a function of ultraviolet irradiance to be obtained. This information may be used for implementing a notification mechanism based upon both of the estimates, for example in contexts of application in which the ultraviolet radiant flux is weak and even so produces an increase of temperature in the vicinity of the device.

Furthermore, the present device is intrinsically immune from the noise caused by absorption of infrared radiation generated by hot bodies, thanks to the substantial insensitivity of UV detectors made of silicon carbide to this type of radiation.

In addition, the present manufacturing method makes it possible to vary the sensitivity to temperature variations by acting on the parameters of the silicidation process (duration, annealing temperature, and nitrogen flow).

In conclusion, it is clear that modifications and variations may be made to what has been described and illustrated herein, without thereby departing from the sphere of protection of the present disclosure.

For instance, the semiconductor body may be made, rather than of silicon carbide, of a different semiconductor material, such as for example a semiconductor chosen from among gallium nitride (GaN), silicon (Si), or gallium and aluminum nitride (AlGaN).

The anode regions of at least one of the two UV detectors of the device may have different geometries; for example, at least one of the anode regions may have a comb-fingered shape, or in any case be formed by a plurality of sub-regions set apart from, and parallel to, one another. Furthermore, the anode regions may be made of a metal material, such as for example platinum, nickel, or gold, instead of a silicide.

As regards the first and second conductive layers, they may be made of a material different from nickel, such as for example titanium. In this case, the first and second anode regions are made of titanium silicide.

As regards the bottom contact region 20, it may be absent, in which case the bottom multilayer structure 22 contacts the substrate 6 directly. Likewise, also the buffer epitaxial layer 7 may be absent.

As regards the manufacturing method, it is possible for the steps of the aforesaid method to be carried out in an order different from the one described.

Finally, the types of doping may be reversed with respect to what has been described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device for a system for measuring temperature, said device comprising a first UV detector and a second UV detector, said first and second UV detectors being configured to generate a first current and a second current, respectively, as a function of an ultraviolet irradiance; and wherein the first and second UV detectors have coefficients of variation of current with temperature, at constant irradiance, that are different from one another.

2. The device according to claim 1, wherein:
the first UV detector includes:
a first cathode region of semiconductor material; and
a first anode region arranged in contact with the first cathode region; and
the second UV detector includes:
a second cathode region of semiconductor material; and
a second anode region arranged in contact with the second cathode region;
the first anode region and the first cathode region form a first Schottky junction; and
the second anode region and the second cathode region form a second Schottky junction.

3. The device according to claim 2, wherein said first and second cathode regions are made of silicon carbide.

4. The device according to claim 2, wherein said first and second anode regions are made of a silicide.

5. The device according to claim 2, wherein the first and second UV detectors are formed in a die which comprises a body of semiconductor material, said body forming the first and second cathode regions; and wherein the first and second anode regions are arranged in contact with said body and are laterally spaced apart with respect to one another.

6. The device according to claim 5, wherein said body has a front surface, said first and second anode regions extending in contact with said front surface; and
wherein at least one of the first and second anode regions is patterned in such a way as to expose an underlying portion of the front surface.

7. The device according to claim 6, wherein the first and second anode regions are patterned in such a way as to expose a first portion and a second portion of the front surface, respectively, the first and second exposed portions of the front surface having different areas.

8. A system comprising:
a semiconductor device that includes:
a first UV detector and a second UV detector, said first and second UV detectors being configured to generate a first current and a second current, respectively, as a function of an ultraviolet irradiance; and wherein the first and second UV detectors have coefficients of variation of current with temperature, at constant irradiance, that are different from one another; and a processing unit electrically coupled to the first UV detector and to the second UV detector and configured to determine an estimate of a variation of a temperature of the semiconductor device based on a first quantity and a second quantity indicating, respectively, a variation of the first current and a variation of the second current.

9. The system according to claim 8, wherein:
the first UV detector includes:
a first cathode region of semiconductor material; and
a first anode region arranged in contact with the first cathode region; and
the second UV detector includes:
a second cathode region of semiconductor material; and
a second anode region arranged in contact with the second cathode region;
the first anode region and the first cathode region form a first Schottky junction; and
the second anode region and the second cathode region form a second Schottky junction.

10. The system according to claim 9, wherein said first and second cathode regions are made of silicon carbide.

11. The system according to claim 9, wherein the first and second UV detectors are formed in a die which comprises a body of semiconductor material, said body forming the first and second cathode regions; and wherein the first and second anode regions are arranged in contact with said body and are laterally spaced apart with respect to one another.

12. The system according to claim 11, wherein said body has a front surface, said first and second anode regions extending in contact with said front surface; and wherein at least one of the first and second anode regions is patterned in such a way as to expose an underlying portion of the front surface.

13. The system according to claim 12, wherein the first and second anode regions are patterned in such a way as to expose a first portion and a second portion of the front surface, respectively, the first and second exposed portions of the front surface having different areas.

14. A method, comprising:
manufacturing a semiconductor device for a system for measuring temperature, said manufacturing including forming a first UV detector and a second UV detector, which are configured to generate a first current and a second current, respectively, as a function of the irradiance in the ultraviolet band; and wherein forming said first and second UV detectors includes forming said first and second UV detectors with coefficients of variation of the current with temperature, at constant irradiance, that are different from one another.

15. The method according to claim 14, wherein the forming includes:
forming a first cathode region of semiconductor material;
forming a first anode region, so that it forms a first Schottky junction with the first cathode region;
forming a second cathode region of semiconductor material; and
forming a second anode region, so that it forms a second Schottky junction with the second cathode region.

16. The method according to claim 15, comprising making said first and second cathode regions of silicon carbide.

17. The method according to claim 15, comprising making said first and second anode regions of a silicide.

18. The method according to claim 15, wherein forming said first and second UV detectors includes forming said first and second UV detectors in one and the same die, which includes a semiconductor body, in such a way that said body forms the first and second cathode regions;
and wherein forming the first and second anode regions comprises:
forming a conductive layer in contact with the semiconductor body; and
selectively removing portions of the conductive layer in such a way as to separate a first portion and a second portion of the conductive layer;
and wherein forming the first and second anode regions comprise carrying out a silicidation of said first and second portions of the conductive layer.

19. The method according to claim 18, further comprising forming a dielectric region in contact with said semiconductor body, said dielectric region being arranged between the first and second anode regions.

20. The method according to claim 19, wherein forming the first and second anode regions comprise forming the first and second anode regions so that they expose, respectively, a first underlying portion and a second underlying portion of semiconductor body, which have different areas.

* * * * *